(12) United States Patent
Cohen et al.

(10) Patent No.: US 10,056,464 B2
(45) Date of Patent: *Aug. 21, 2018

(54) III-V GATE-ALL-AROUND FIELD EFFECT TRANSISTOR USING ASPECT RATIO TRAPPING

(71) Applicant: International Business Machines Corporation, Armonk, NY (US)

(72) Inventors: Guy M. Cohen, Ossining, NY (US); Sanghoon Lee, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/414,591

(22) Filed: Jan. 24, 2017

(65) Prior Publication Data

US 2017/0133485 A1    May 11, 2017

Related U.S. Application Data

(63) Continuation of application No. 14/749,728, filed on Jun. 25, 2015, now Pat. No. 9,590,107.

(51) Int. Cl.

| | |
|---|---|
| *H01L 29/66* | (2006.01) |
| *H01L 29/06* | (2006.01) |
| *H01L 29/08* | (2006.01) |
| *H01L 29/40* | (2006.01) |
| *H01L 29/417* | (2006.01) |

(Continued)

(52) U.S. Cl.
CPC .... *H01L 29/66522* (2013.01); *H01L 27/0886* (2013.01); *H01L 29/0649* (2013.01);
(Continued)

(58) Field of Classification Search
CPC ........... H01L 29/42392; H01L 29/7869; H01L 29/205; H01L 29/1054; H01L 29/0673; H01L 29/7841; H01L 29/2003; H01L 29/20; H01L 29/66795; H01L 29/785; H01L 29/7856; H01L 29/201; H01L 29/41791; H01L 29/0657; H01L 29/51;
(Continued)

(56) References Cited

U.S. PATENT DOCUMENTS

| | | |
|---|---|---|
| 8,173,551 B2 | 5/2012 | Bai et al. |
| 8,872,225 B2 | 10/2014 | Chu-Kung et al. |

(Continued)

FOREIGN PATENT DOCUMENTS

| | | |
|---|---|---|
| WO | 2015047344 A1 | 4/2015 |
| WO | 2015047353 A1 | 4/2015 |

*Primary Examiner* — Davienne Monbleau
*Assistant Examiner* — Changhyun Yi
(74) *Attorney, Agent, or Firm* — Louis J. Percello, Esq.; Otterstedt, Ellenbogen & Kammer, LLP (57) ABSTRACT

Embodiments of the invention provide methods for forming III-V gate-all-around field effect transistors on silicon substrates that utilize Aspect-Ratio Trapping to reduce or eliminate dislocation defects associated with lattice mismatches. A field dielectric material defining a trench is formed on a crystalline silicon substrate. A channel feature comprising III-V material is subsequently formed inside the trench. Source/drain features are then formed at both ends of the channel feature inside the trench. Lastly, gate dielectric layers and a gate feature are formed surrounding a portion of the channel feature.

10 Claims, 13 Drawing Sheets

(51) Int. Cl.
  *H01L 29/423* (2006.01)
  *H01L 29/51* (2006.01)
  *H01L 27/088* (2006.01)
  *H01L 29/78* (2006.01)
  *H01L 29/201* (2006.01)

(52) U.S. Cl.
  CPC ...... *H01L 29/0673* (2013.01); *H01L 29/0847* (2013.01); *H01L 29/201* (2013.01); *H01L 29/401* (2013.01); *H01L 29/41791* (2013.01); *H01L 29/42392* (2013.01); *H01L 29/51* (2013.01); *H01L 29/66553* (2013.01); *H01L 29/7856* (2013.01); *H01L 2029/7858* (2013.01)

(58) Field of Classification Search
  CPC ...... H01L 29/66553; H01L 2029/7858; B82Y 10/00; B82Y 40/00
  See application file for complete search history.

(56) References Cited

U.S. PATENT DOCUMENTS

| | | | |
|---|---|---|---|
| 8,987,794 B2 | 3/2015 | Rachmady et al. | |
| 9,590,107 B2* | 3/2017 | Cohen | H01L 29/7856 |
| 2013/0099283 A1* | 4/2013 | Lin | H01L 29/267 |
| | | | 257/190 |
| 2013/0161756 A1* | 6/2013 | Glass | H01L 29/66545 |
| | | | 257/369 |
| 2014/0175509 A1 | 6/2014 | Chu-Kung et al. | |
| 2014/0203326 A1 | 7/2014 | Mukherjee et al. | |
| 2014/0346564 A1 | 11/2014 | Doornbos et al. | |
| 2014/0353574 A1* | 12/2014 | Li | H01L 29/0673 |
| | | | 257/9 |
| 2015/0084041 A1 | 3/2015 | Hur et al. | |
| 2017/0200804 A1* | 7/2017 | Chen | H01L 29/6653 |

* cited by examiner

III-V GATE-ALL-AROUND FIELD EFFECT TRANSISTOR USING ASPECT RATIO TRAPPING

CROSS-REFERENCE TO RELATED APPLICATIONS

This application is a continuation of U.S. patent application Ser. No. 14/749,728 filed Jun. 25, 2015, the complete disclosure of which is expressly incorporated herein by reference in its entirety for all purposes.

STATEMENT OF GOVERNMENT RIGHTS

Not Applicable

BACKGROUND OF THE INVENTION

The present invention relates generally to the electrical, electronic and computer arts, and, more particularly, to forming III-V gate-all-around field effect transistors in integrated circuits with silicon substrates.

Multi-gate field effect transistors (FETs) are of considerable interest because of their superior electrostatic integrity, as well as their promise of lower supply voltages, reduced threshold voltages, and extended scalability. FinFETs are one form of such multi-gate device. In a finFET, a gate typically accesses two or three faces of a channel. However, as the fin width of finFETs approaches five nanometers, channel width variation may cause undesirable variability and mobility loss.

One possible technology that may be able to circumvent this problem is gate-all-around (GAA) FETs. In a GAA FET, a gate is made to surround a channel, which may be structured as a nanowire or a nanosheet (a nanosheet being a nano-sized rectangular cuboid). Such an arrangement provides for the greatest capacitive coupling between the gate and the channel. Incorporating indium gallium arsenide into such GAA FETs may be of particular benefit because of its extremely high electron mobility when compared to silicon, as well as lower operation voltage.

Integrating highly crystalline III-V materials such as indium gallium arsenide with silicon has historically been difficult because of lattice mismatches. One promising technique for effectively growing III-V materials on silicon substrates is Aspect-Ratio Trapping (ART). In an ART-based process, III-V materials are grown on a silicon substrate inside narrow trenches of silicon dioxide. With such techniques, dislocation defects may be significantly reduced or eliminated. Nevertheless, ART processes dictate a specific layout for the III-V devices. Thus the formation of III-V GAA FETs using ART remains challenging.

BRIEF SUMMARY

Embodiments of the invention provide methods for forming III-V GAA FETs on silicon substrates that utilize ART to reduce or eliminate dislocation defects associated with lattice mismatches.

Aspects of the invention are directed to a method for forming an integrated circuit. A field dielectric material defining a trench is formed on a crystalline silicon substrate. A channel feature comprising III-V material is subsequently formed inside the trench. Source/drain features are then formed at both ends of the channel feature inside the trench. Lastly, gate dielectric layers and a gate feature are formed surrounding a portion of the channel feature.

Even additional aspects of the invention are directed to a method for forming an integrated circuit comprising the steps of:

a) forming a stack comprising a temporary layer and a channel layer on a substrate inside a trench in a field dielectric material;

b) removing portions of the field dielectric material to expose sides of a channel portion of the temporary layer and sides of a channel portion of the channel layer;

c) removing the channel portion of the temporary layer to form a tunnel below the channel portion of the channel layer;

d) filling the tunnel and volumes vacated by removing portions of the field dielectric material with a sacrificial material;

e) removing a respective portion of the temporary layer and a respective portion of the channel layer in the trench on each side and in spaced relation to the sacrificial material in the tunnel and the channel portion of the channel layer to define empty source/drain volumes;

f) replacing the temporary layer in the trench between the empty source/drain volumes and the sacrificial material in the tunnel with spacer features;

g) forming source/drain features inside the source/drain volumes;

h) removing the sacrificial material; and i) forming gate dielectric layers and a gate feature surrounding at least a portion of the channel portion of the channel layer.

Moreover, even additional aspects of the invention are directed to a field effect transistor comprising a trench, source/drain features, a channel feature, gate dielectric layers, and a gate feature. The trench is in a field dielectric material on a crystalline silicon substrate. The source/drain features are inside the trench. The channel feature comprises a III-V material in the trench and spans between the source/drain features. Lastly, the gate dielectric layers and the gate feature surround a portion of the channel feature.

BRIEF DESCRIPTION OF THE SEVERAL VIEWS OF THE DRAWINGS

The following drawings are presented by way of example only and without limitation, wherein like reference numerals (when used) indicate corresponding elements throughout the several views, and wherein.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

The present invention will be described with reference to illustrative embodiments. For this reason, numerous modifications can be made to these embodiments and the results will still come within the scope of the invention. No limitations with respect to the specific embodiments described herein are intended or should be inferred.

Figure 1A:
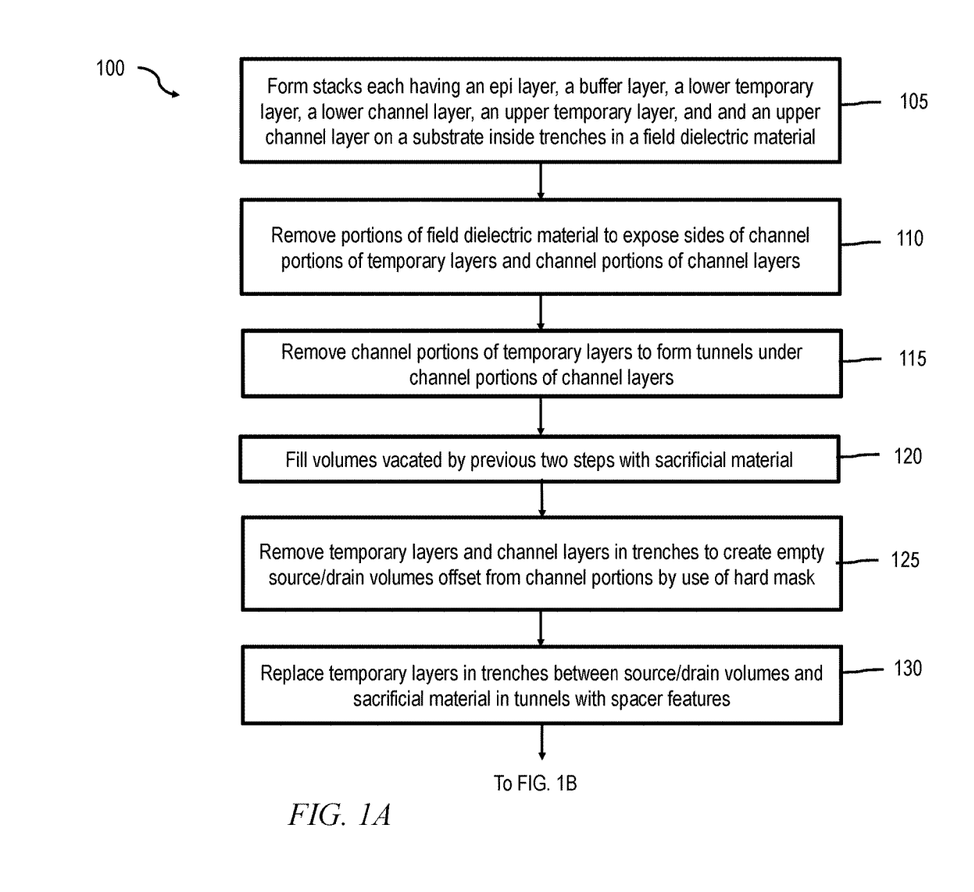
FIGS. 1A and 1B show a flow diagram of a method for forming an integrated circuit, in accordance with an illustrative embodiment of the invention.
Figure 1B:
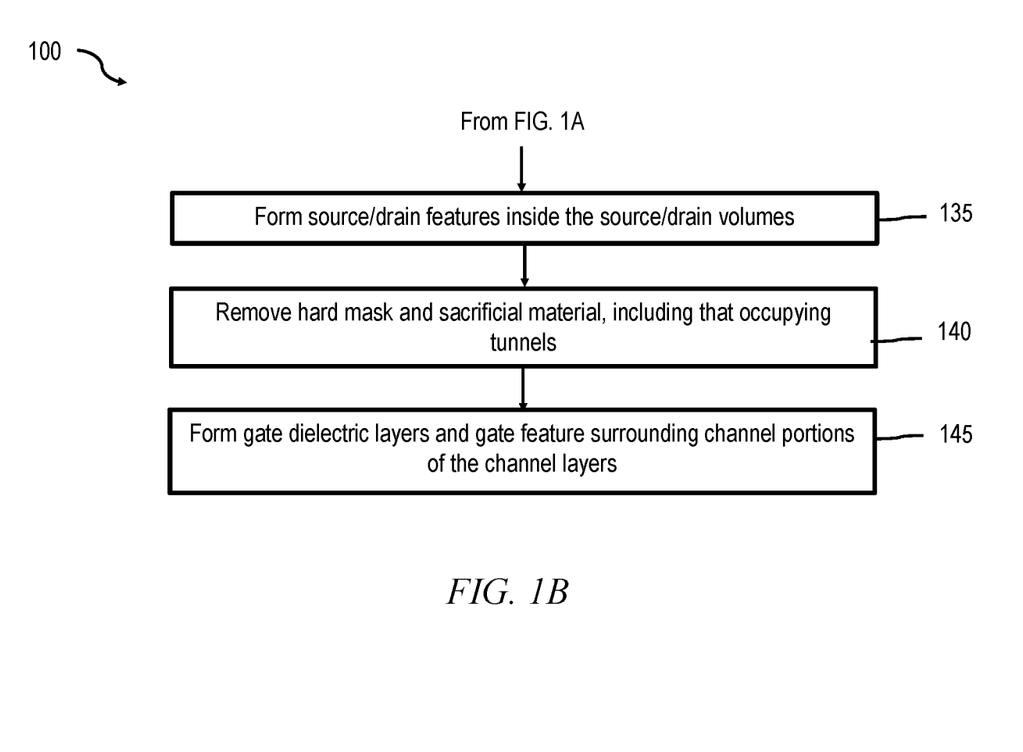

FIGS. 1A and 1B show a flow diagram of a method 100 in accordance with an illustrative embodiment of the invention for forming an integrated circuit, and, more specifically, for forming a III-V GAA Nanosheet FET, while FIGS. 2A-2K show perspective views of intermediate film stacks formed during the processing. Although the method 100 and the structures formed thereby are entirely novel, the individual processing steps required to implement the method 100 may utilize conventional semiconductor fabrication techniques and conventional semiconductor fabrication tooling. These techniques and tooling will already be familiar to one having ordinary skill in the relevant arts given the teachings herein. Moreover, many of the processing steps and tooling used to fabricate semiconductor devices are also described in a number of readily available publications, including, for example: P. H. Holloway et al., *Handbook of Compound Semiconductors: Growth, Processing, Characterization, and Devices*, Cambridge University Press, 2008; and R. K. Willardson et al., *Processing and Properties of Compound Semiconductors*, Academic Press, 2001, which are both hereby incorporated by reference herein. It is emphasized that while some individual processing steps are set forth herein, those steps are merely illustrative and one skilled in the art may be familiar with several equally suitable alternatives that would also fall within the scope of the invention.

Figure 2A:
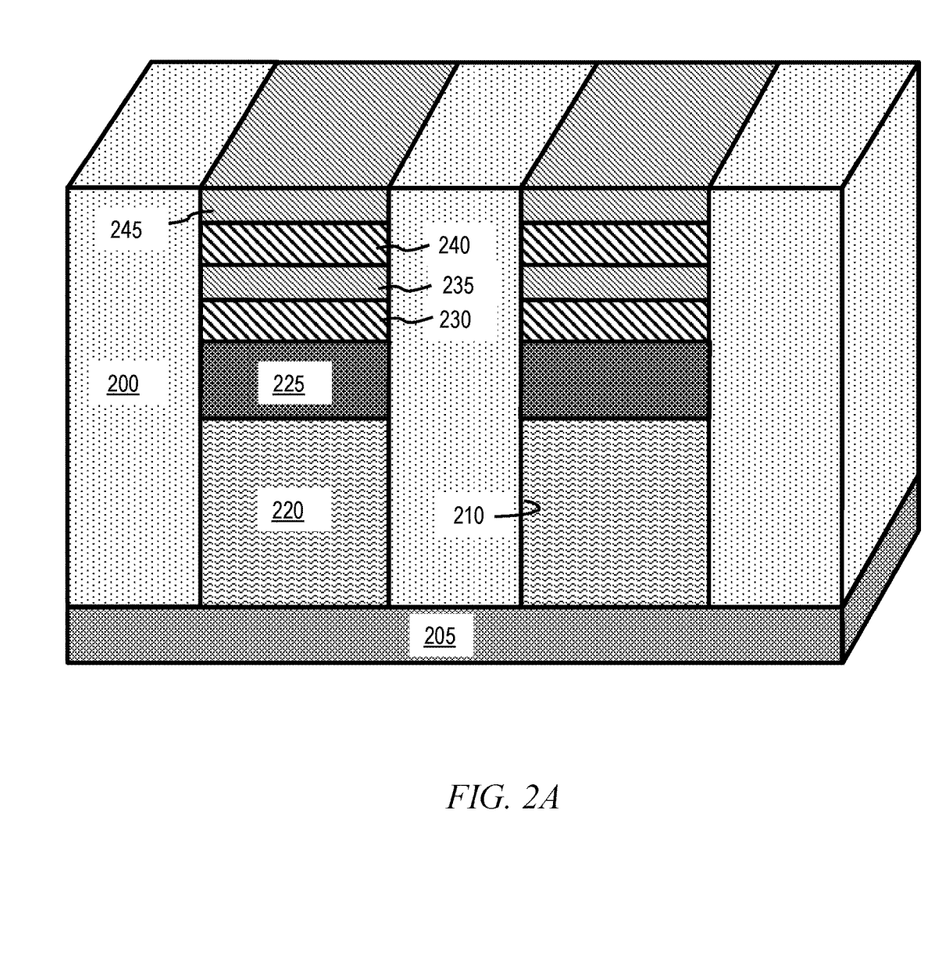
FIGS. 2A-2K show sectional views of intermediate film stacks formed when performing the method of FIGS. 1A and 1B.

The method 100 starts at step 105, which results in the film stack shown in FIG. 2A. In step 105, a field dielectric material 200 is deposited on a substrate 205, and two parallel trenches 210 are formed in the field dielectric material 200. The substrate 205 may comprise, for example, crystalline silicon, while the field dielectric material 200 may comprise silicon dioxide. The field dielectric material 200 may be fabricated by thermal growth of silicon dioxide or chemical vapor deposition (CVD), followed by lithography and reactive ion etching (RIE). A respective stack consisting of an epitaxial layer (epi layer) 220, a buffer layer 225, a lower temporary layer 230, a lower channel layer 235, an upper temporary layer 240, and an upper channel layer 245 is then formed inside each trench 210. In one embodiment of the invention, the epi layer 220 may comprise gallium arsenide, the buffer layer 225 may comprise indium aluminum arsenide, the temporary layers 230, 240 may comprise indium phosphide, and the channel layers 235, 245 may comprise undoped indium gallium arsenide or indium gallium arsenide doped to be slightly p-type. In one or more embodiments, the indium gallium arsenide, for example, may comprise In(0.53)Ga(0.47)As, which is an alloy well lattice matched to the underlying indium phosphide. Forming of the layers 220, 225, 230, 235, 240, 245 may be by selective epitaxy where the new semiconductor material is added over an existing semiconductor with effectively no deposition occurring on the field dielectric material 200. The layers 220, 225, 230, 235, 240, 245 are epitaxially registered to the underlying silicon substrate 205. Methods such as metal-organic chemical vapor deposition (MOCVD) or metal-organic molecular beam epitaxy (MOMBE) can be used to deposit the semiconductor films. Precursors such as trimethylindium and trimethylgallium are typically used for group-III elements, and arsine and phosphine are used for group-V elements with these deposition methods.

If the above-described materials are utilized, it will be recognized that method 100 is a form of ART processing, wherein III-V materials are formed on a silicon substrate inside a trench having sidewalls formed of a non-crystalline material. In such a process, dislocation defects in the III-V materials that result from the lattice mismatch with the silicon tend to terminate in the sidewalls of the non-crystalline material and do not migrate to the surface of the III-V material. Bulk defects are thereby reduced to acceptable levels. ART processing and its influence on defects is described in some detail in, for example, U.S. Pat. No. 8,173,551 to J. Bai et al. and entitled "Defect Reduction Using Aspect Ratio Trapping," which is also hereby incorporated by reference herein.

Figure 2B:
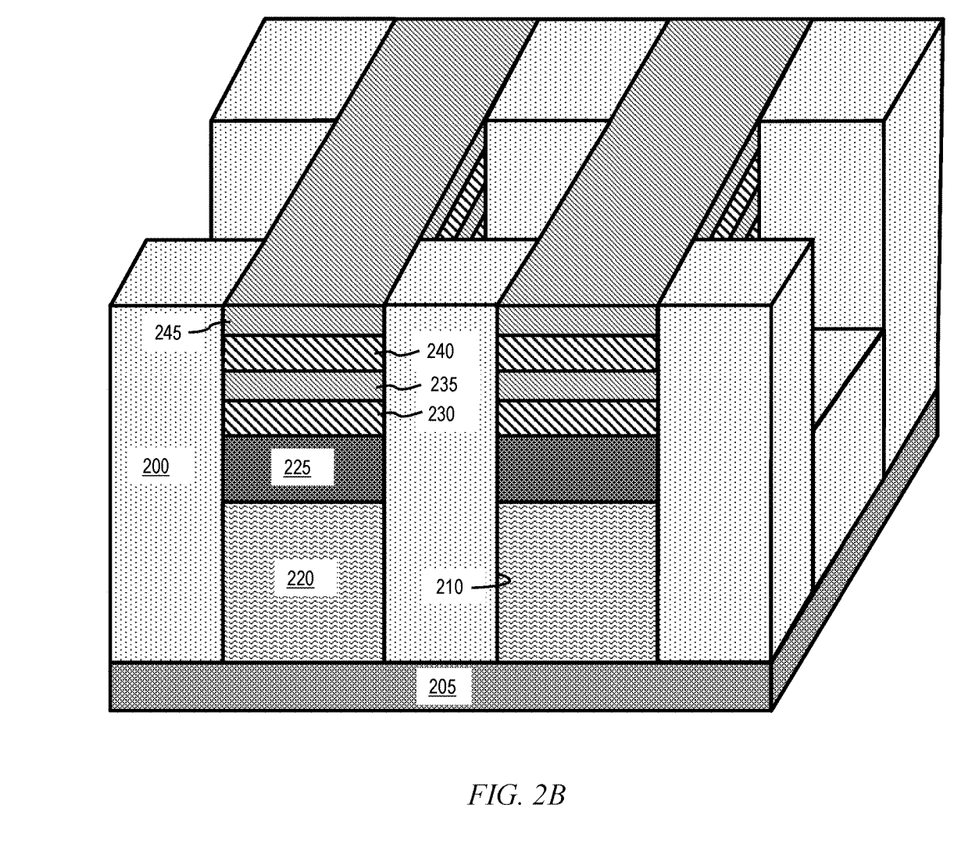

Next, in step 110, portions of the field dielectric material 200 are removed to about the height of the epi layer 220 to expose sides of central portions of the temporary layers 230, 240 as well as sides of central portions of the channel layers 235, 245. The removed volume of the field dielectric material 200 runs substantially perpendicular to the orientation of the trenches 210. Lithography and RIE of the field dielectric material 200 selective to the upper channel layers 245 may be utilized. The resultant film stack is shown in FIG. 2B. The exposed portions of the channel layers 235, 245 will ultimately become the channel features for the FET, so these exposed portions are referenced hereinafter as the "channel portions of the channel layers 235, 245." The exposed portions of the temporary layers 230, 240 are likewise referenced as the "channel portions of the temporary layers 230, 240."

Figure 2C:
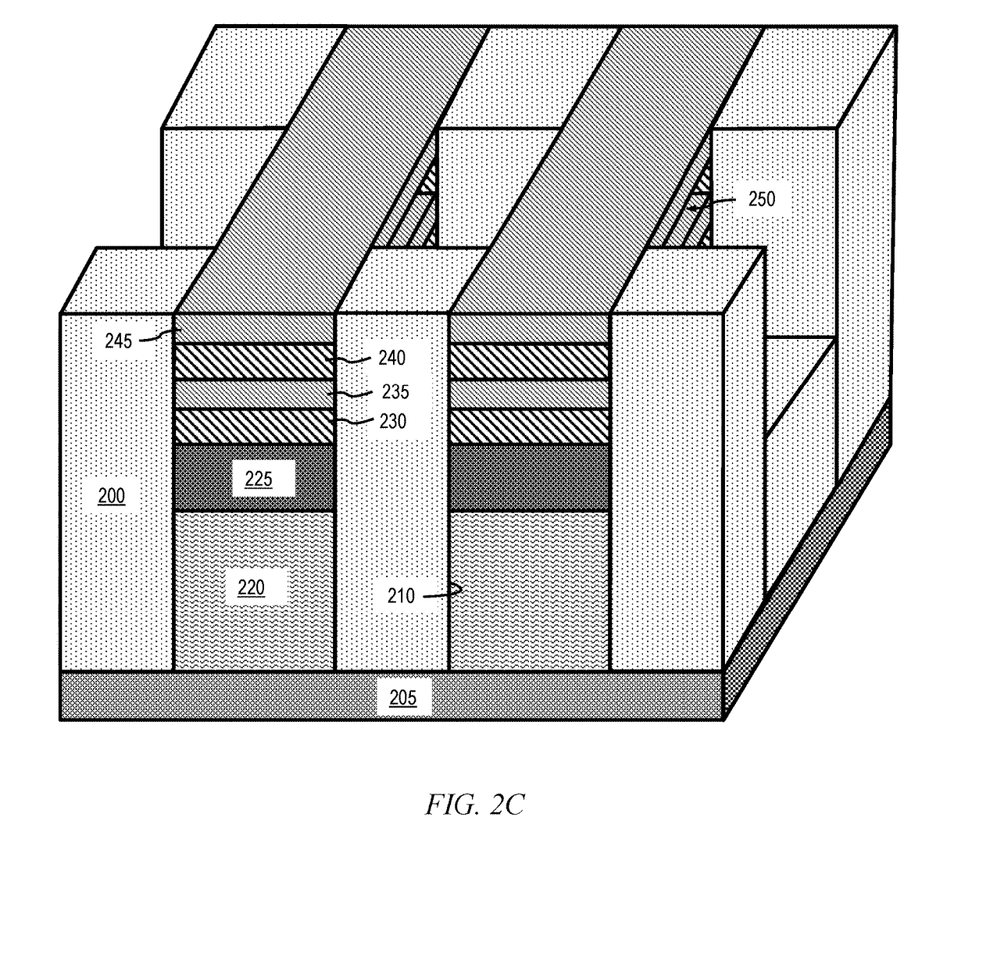

In step 115, the channel portions of the temporary layers 230, 240 are removed to yield the film stack shown in FIG. 2C. This processing forms tunnels 250 under the channel portions of the channel layers 235, 245. Processing may be by an isotropic etch of the temporary layers 230, 240 selective to the other exposed materials. Etching may be by, for example, immersion in a wet chemical bath. As an example, when the channel layers 235, 245 comprise indium gallium arsenide and the temporary layers 230, 240 comprise indium phosphide, a hydrochloric-acid/water chemistry may be used to remove the indium phosphide layers selectively with respect to the indium gallium arsenide layers.

Figure 2D:
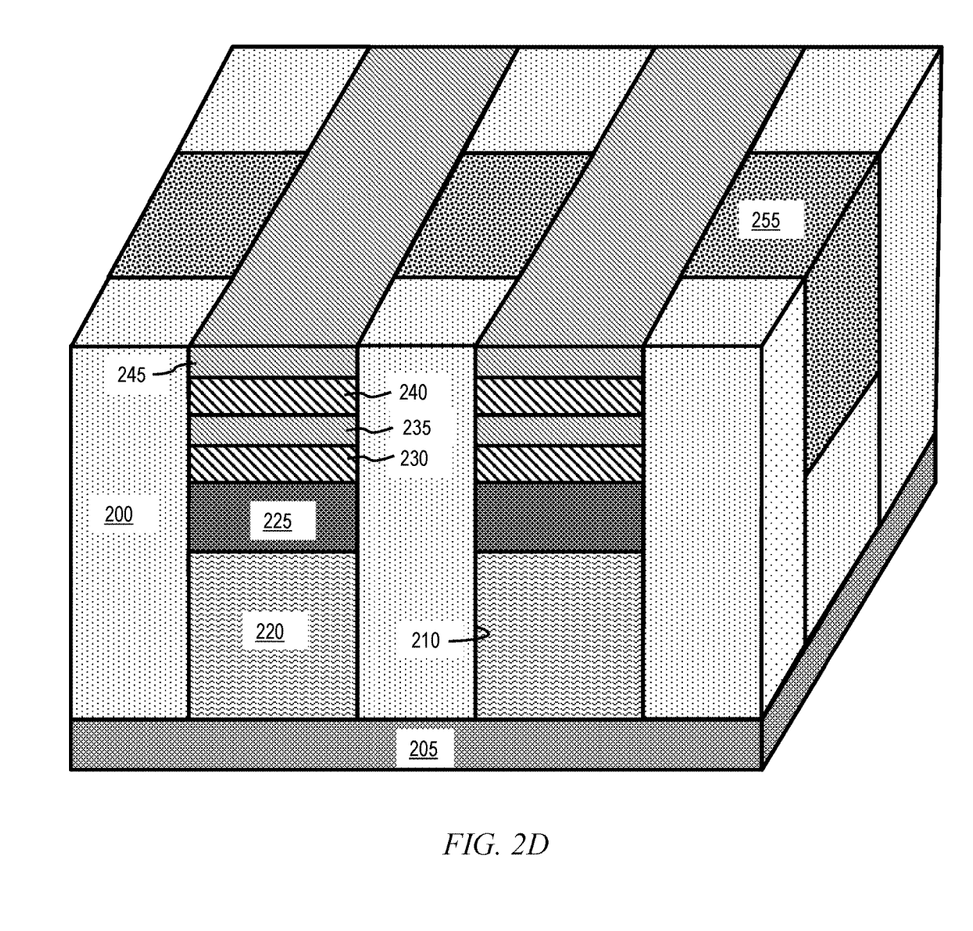

Next, in step 120 the volumes vacated in steps 110 and 115 (including the tunnels 250) are filled with a sacrificial material 255 to yield the film stack shown in FIG. 2D. The sacrificial material 255 may, for example, comprise silicon nitride. The sacrificial material 255 may be deposited by CVD, and excess material on the horizontal surfaces removed by chemical mechanical polishing (CMP).

Figure 2E:
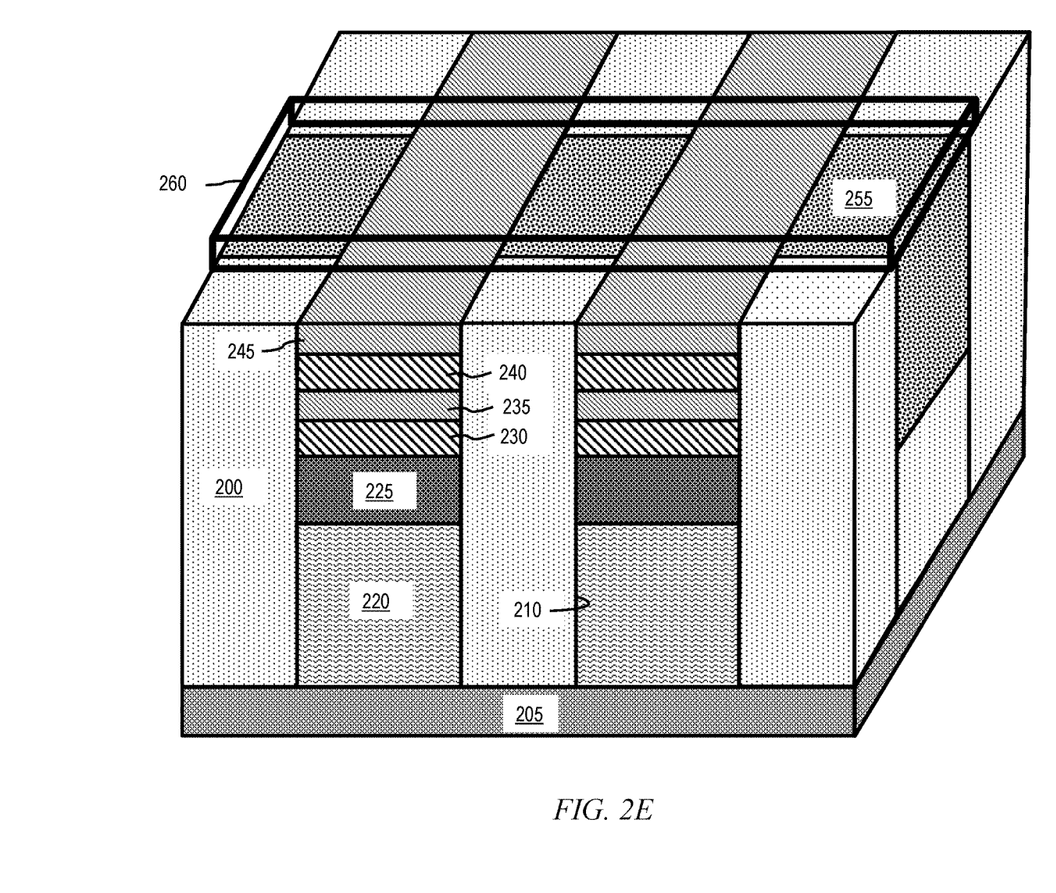
Figure 2F:
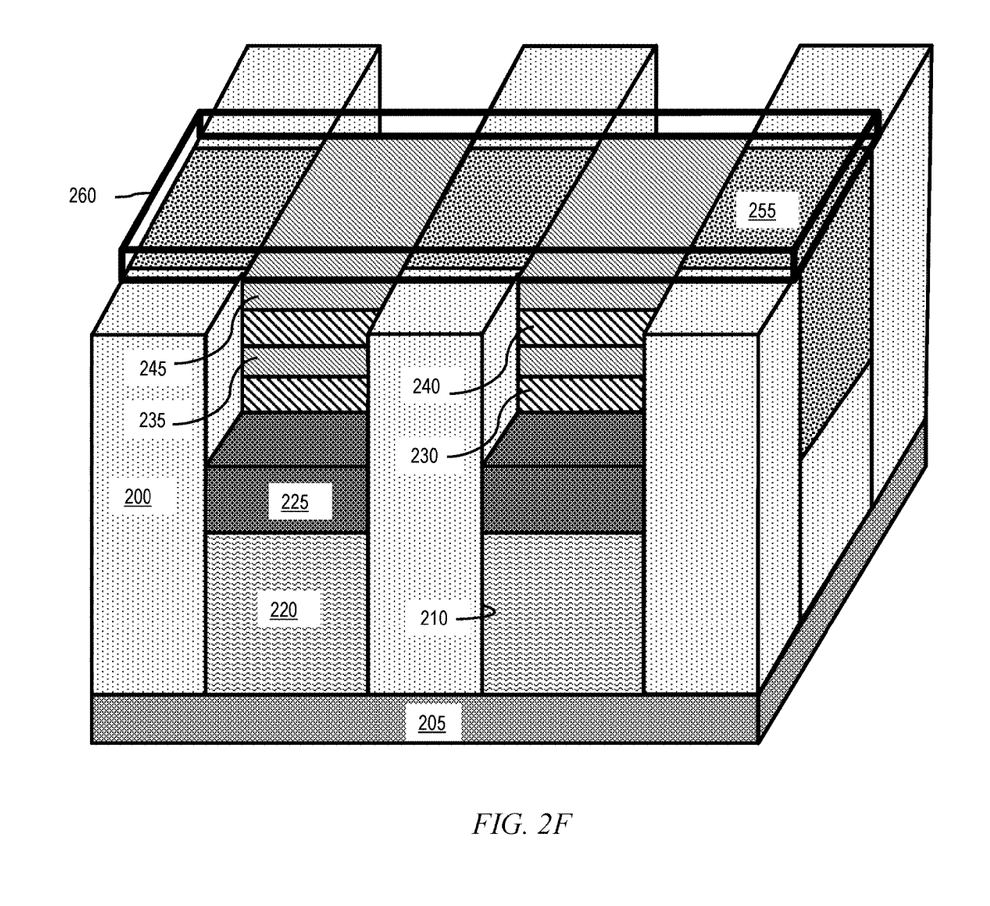
Figure 2G:
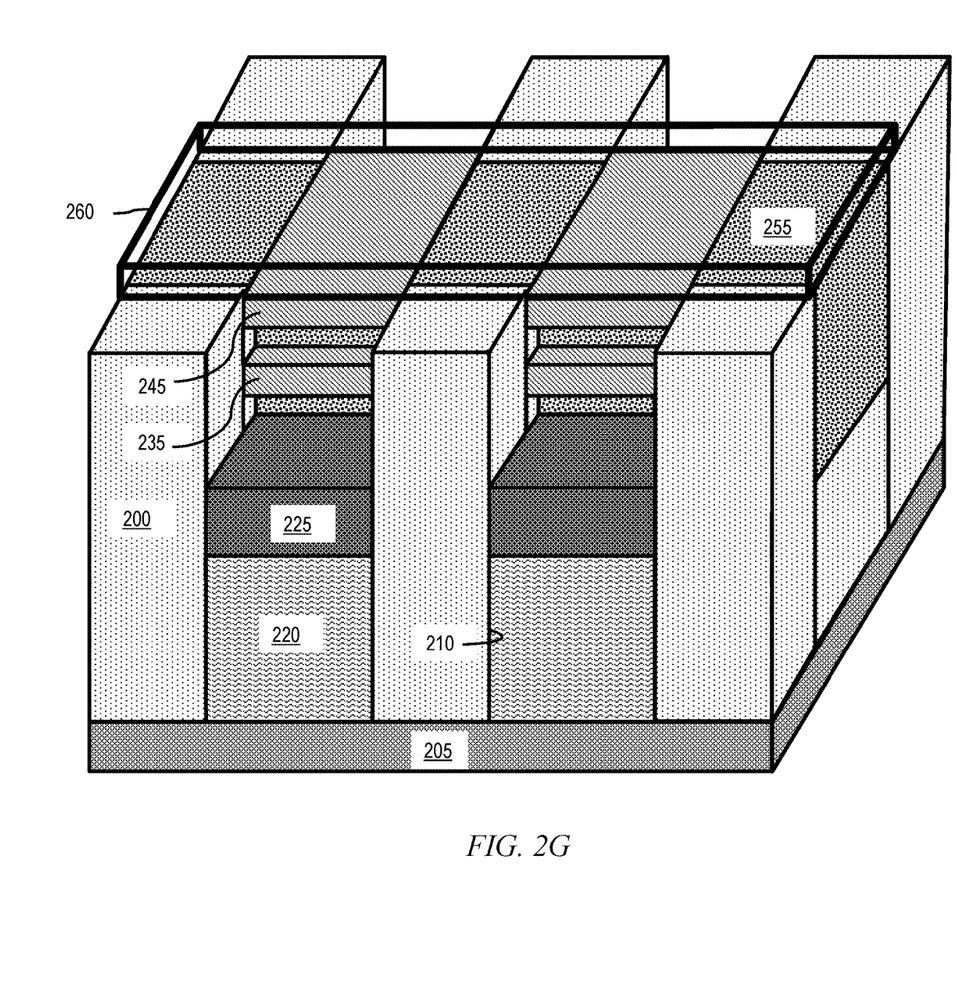
Figure 2H:
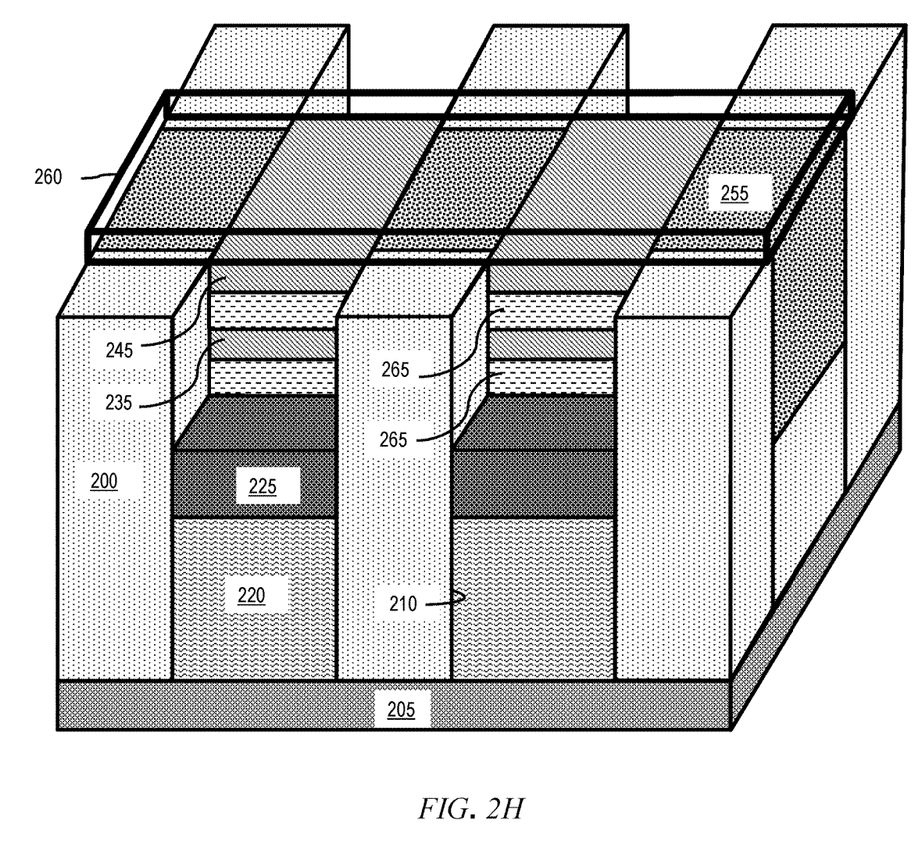

In step 125, volumes for the source/drain features are formed in the trenches 210. Initially, a hard mask 260 is deposited on the film stack, as shown in FIG. 2E. The hard mask 260 is slightly wider than the channel portions of the channel layers 235, 245. With the hard mask 260 in place, the channel layers 235, 245 and the temporary layers 230, 240 are removed from the trenches 210 in those regions that are not covered. Processing may be by RIE selective to the buffer layer 225. The result of this patterning is shown in FIG. 2F. Empty volumes for the source/drain features are defined in the trenches 210 on opposite sides of, and in spaced relation to, the channel portions of the channel layers 235, 245 and the sacrificial material 255 occupying the tunnels 250.

Step 130 causes the remaining portions of the upper and lower temporary layers 230, 240 that are located between the source/drain volumes and the sacrificial material 255 occupying the trenches 210 to be replaced by spacer features. First the temporary layers 230, 240 are removed, yielding the result shown in FIG. 2G. Processing may be by, for example, wet etching selective to the other exposed materials. Subsequently, spacer features 265 are made to fill the volumes just vacated by the temporary layers 230, 240 to yield the film stack shown in FIG. 2H. Here, processing may be by conformal CVD followed by directional RIE of any spacer material deposited on the horizontal surfaces. A purpose of spacer 265 is to reduce the gate to source or drain capacitance. We note that while increasing the spacer thickness leads to reduced capacitance, C, it also leads to an increase in the series resistance, R, from the source/drain to the nanosheet channel(s). Therefore, a spacer thickness that minimizes the R×C product is preferred. In one or more embodiments, the spacer features 265 may comprise, for example, a low-k dielectric such as dense SiCOH. In yet another embodiment, a boron nitride spacer may be used because it has a relatively low-k and very low etch rate in diluted hydrofluoric acid, which is used to etch silicon dioxide. In even other embodiments the spacer may be formed of other dielectrics such as oxynitride, hafnium oxide, and aluminum oxide.

Figure 2I:
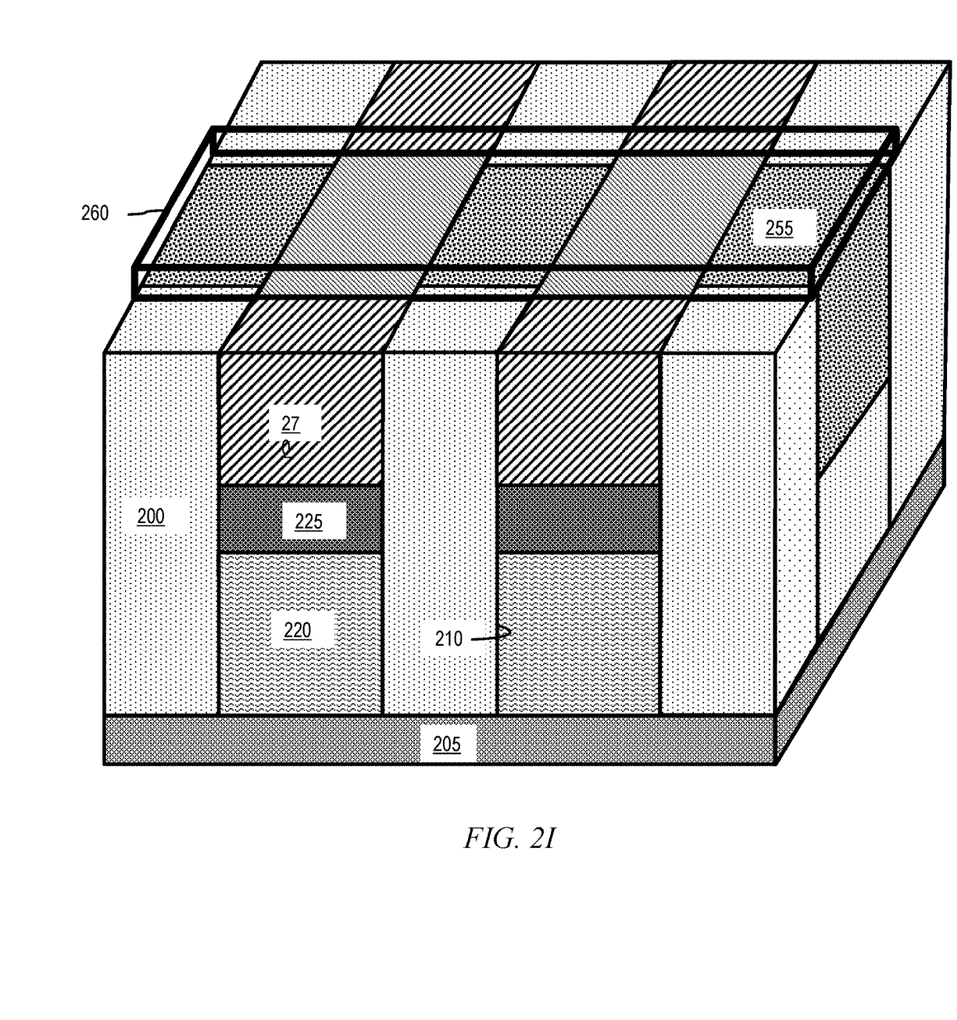

Step 135 forms the source/drain features 270 in the source/drain volumes to yield the film stack shown in FIG. 2I. The source/drain features 270 may comprise, for instance, indium gallium arsenide doped to be highly n-type. Deposition may be by selective MOCVD, or MOMBE epitaxy with growth occurring predominantly on the buffer layers 225. The source/drain features 270 form a direct contact, (i.e. a clean interface) with the exposed sidewalls of the remaining channel layers 235, 245. The doping of the source/drain features 270 may be achieved by adding the dopant (e.g., Si, Te or Sn) during the growth of the source/drain material. This process is also referred to as "in-situ doping." For example, when growing indium gallium arsenide as source/drain features 270, silane may be added to the gas mixture of trimethylindium, trimethylgallium and arsine. Other dopant precursors may be used such as silicon tetrachloride and silicon tetrabromide. To achieve good planarization, the material forming the source/drain features 270 may be overgrown and polished back by CMP to be flashed with the hard mask 260.

Figure 2J:
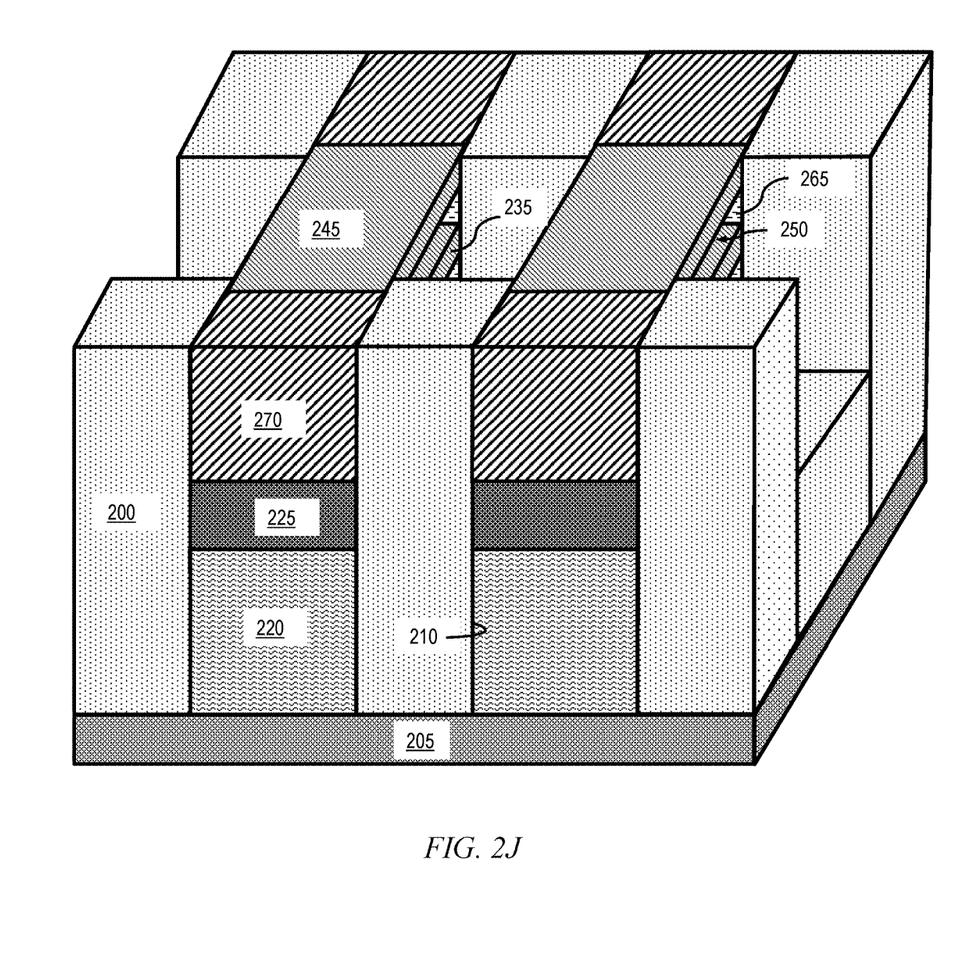

Subsequently, in step 140, the hard mask 260 and the sacrificial material 255 are removed, including the sacrificial material 255 occupying the tunnels 250. Both steps may occur by wet etching selective to the other exposed materials. The result of this etching is shown in FIG. 2J. As can be seen in the figure, the tunnels 250 are re-exposed by this processing, allowing all sides of the channel portions of the channel layers 235, 245 to be accessed in the next step.

Figure 2K:
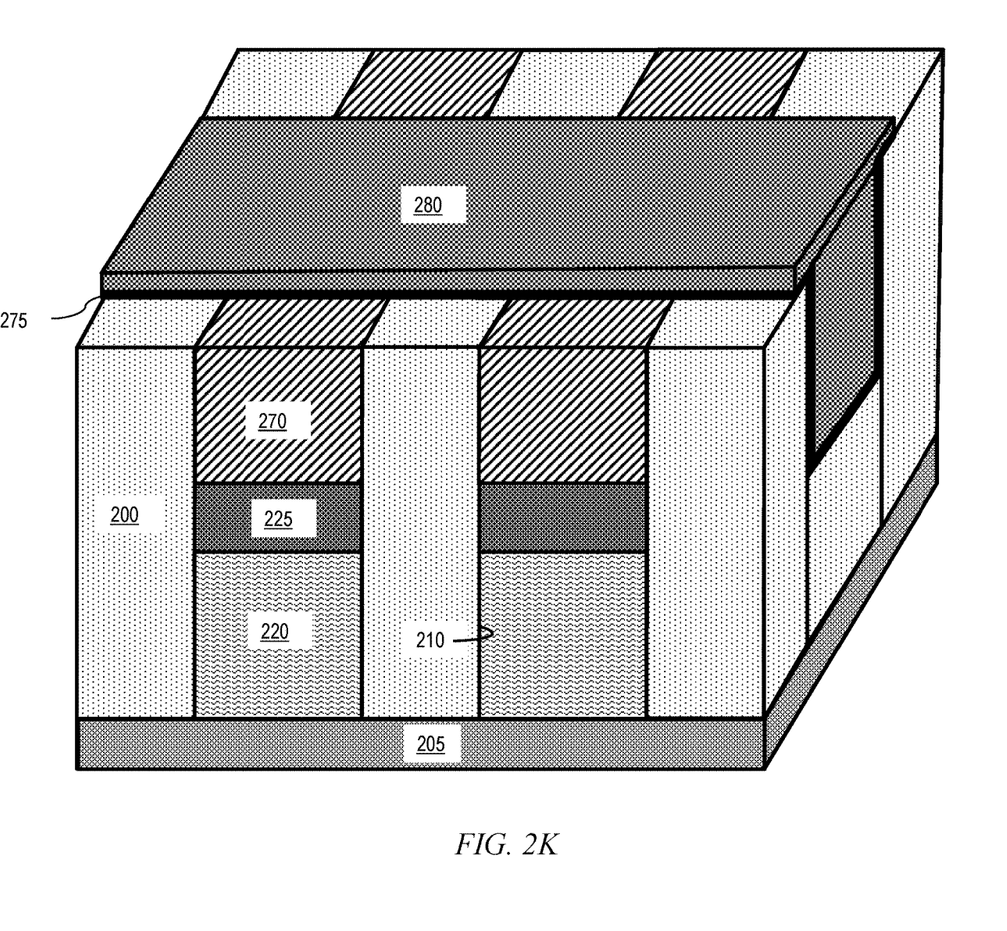

Lastly, in step 145, gate dielectric layers 275 are formed on the now-suspended channel portions of the channel layers 235, 245, and the gate feature 280 is formed on the gate dielectric layers 275. Forming of the gate dielectric layers 275 and the gate feature 280 may be by atomic layer deposition (ALD) or CVD followed by lithography and RIE to remove excess materials from the tops of the field dielectric material 200 and the source/drain features 270. The result is shown in FIG. 2K. In one or more embodiments, the gate dielectric layers 275 may comprise aluminum oxide, and the gate feature 280 may comprise tungsten nitride.

The film stack shown in FIG. 2K may be operated as a GAA FET. As their names would suggest, once the film stack is properly wired (by, for example, the adding of conductive contacts and lines that access the source/drain features 270 and the gate feature 280), the source/drain features 270 form the source/drains, the gate feature 280 forms the gate, and the channel layers 235, 245 form the channels. The gate dielectric layers 275 and the gate feature 280 surround four respective sides of each of the channels, which are structured as nanosheets. Capacitive coupling between the gate feature 280 and the channel nanosheets is thereby maximized. Using the III-V materials set forth above, operation of the FET may be made to occur in an inversion mode.

It is noted that, in the illustrative method 100, the vertical spacing between the channels in the resultant GAA FET is controlled by the thickness of the upper temporary layer 240 deposited in step 105. That is, in accordance with aspects of the invention, a vertical spacing between vertically adjacent channels is determined by the thickness of an epitaxial intervening layer (i.e., the upper temporary layer 240) formed therebetween during processing. Advantageously, this allows this vertical spacing to be controlled with near atomic layer precision when utilizing modern deposition techniques.

Thus, when distilled somewhat, method 100 provides a means of forming GAA FETs in an integrated circuit via at least the steps of: (i) forming a field dielectric material defining trenches on a crystalline silicon substrate; (ii) forming channel features comprising a III-V material inside the trenches; (iii) forming source/drain features at the ends of the channel features inside the trenches; and (iv) forming gate dielectric layers and a gate feature surrounding portions of each of the channel features.

It should again be emphasized that the above-described embodiments of the invention are intended to be illustrative only. Other embodiments may, for example, utilize different processing steps from those expressly set forth above to also achieve embodiments falling within the scope of the invention.

While the GAA FET shown in FIG. 2K includes two pairs of source/drain features, each having two respective nanosheet channels spanning therebetween, aspects of the invention may also be implemented to form devices with greater or fewer numbers of source/drain pairs and/or greater or fewer numbers of nanosheet channels spanning between each pair. The process may, for example, be modified to form a GAA FET with a pair of source/drain features having greater than two respective nanosheet channels spanning therebetween simply by depositing additional temporary layers and channel layers during step 105 of the method 100. At the same time, the process may also be modified to form a GAA FET with only a single nanosheet channel spanning between a pair of source/drain features by reducing the number of temporary layers and channel layers to just one of each during step 105. The size of the gate moreover, may be modified laterally in step 145 (by, e.g., patterning by lithography and RIE) to encompass greater or fewer pairs of source/drain features and their associated nanosheet channels.

In an alternative process flow falling within the scope of the invention, moreover, the temporary layers may be doped so as to be highly n-type during step 105, and the volumes vacated in steps 110 and 115 may be filled with a gate stack (including a gate dielectric and conductive gate feature) in a manner similar to step 145 without first performing steps 120-140. After such processing, portions of the temporary layers will reside adjacent to the nanosheet channels. These remaining portions of the highly n-doped temporary layers may then be accessed to act as source/drain features for the resultant FET.

At the same time, it is further noted that any particular processing steps set forth above are merely illustrative and should not be interpreted as limiting the scope of the invention. Wet chemical etches may frequently be replaced by isotropic gas-based etches and the like. CVD may often be replaced by ALD, evaporation, ion platting, sputter deposition, deposition by aqueous solutions, thermal spray deposition, and so forth. RIE may often be replaced or combined with ion beam etching, CMP, and others.

The method 100 as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

All the features disclosed herein may be replaced by alternative features serving the same, equivalent, or similar purposes, unless expressly stated otherwise. Thus, unless expressly stated otherwise, each feature disclosed is one example only of a generic series of equivalent or similar features.

Any element in a claim that does not explicitly state "means for" performing a specified function or "step for" performing a specified function is not to be interpreted as a "means for" or "step for" clause as specified in AIA 35 U.S.C. § 112(f). In particular, the use of "step of" in the claims herein is not intended to invoke the provisions of AIA 35 U.S.C. § 112(f).

What is claimed is:

1. A method for forming an integrated circuit comprising the steps of:
   forming a field dielectric material defining a trench on a crystalline silicon substrate;
   forming a channel feature comprising a III-V material inside the trench;
   forming a tunnel below the channel feature inside the trench;
   filling the tunnel with a sacrificial material;
   removing respective portions of the channel feature in the trench on each side and in spaced relation to the sacrificial material in the tunnel to define empty source/drain volumes inside the trench;
   forming source/drain features at both ends of the channel feature inside the source/drain volumes; and
   forming gate dielectric layers and a gate feature surrounding a portion of the channel feature.

2. The method of claim 1, wherein the channel feature comprises indium gallium arsenide.

3. The method of claim 1, wherein the field dielectric material comprises silicon dioxide.

4. The method of claim 1, wherein the channel feature describes a rectangular cuboid.

5. The method of claim 1, wherein the channel feature, the source/drain features, the gate dielectric layers, and the gate feature cooperate to form a gate-all-around field effect transistor switched by the gate feature.

6. The method of claim 1, further comprising the step of forming a second channel feature over the channel feature.

7. The method of claim 6, wherein a vertical spacing between vertically adjacent channel features is determined by the thickness of an epitaxial intervening layer formed therebetween during processing.

8. The method of claim 1, further comprising replacing the sacrificial material in the tunnel with spacer features.

9. The method of claim 1, wherein the III-V material inside the trench is epitaxially registered with the crystalline silicon substrate.

10. The method of claim 1, wherein the source/drain features comprise n-type doped indium gallium arsenide.

* * * * *